(12) United States Patent
Mizuta

(10) Patent No.: US 9,273,396 B2
(45) Date of Patent: Mar. 1, 2016

(54) VAPOR DEPOSITION APPARATUS AND METHOD ASSOCIATED

(75) Inventor: Masashi Mizuta, Tochigi (JP)

(73) Assignee: FURUKAWA CO., LTD., Tokyo (JP)

( * ) Notice: Subject to any disclaimer, the term of this patent is extended or adjusted under 35 U.S.C. 154(b) by 0 days.

(21) Appl. No.: 14/375,821

(22) PCT Filed: Jul. 11, 2012

(86) PCT No.: PCT/JP2012/004466
§ 371 (c)(1),
(2), (4) Date: Jul. 31, 2014

(87) PCT Pub. No.: WO2013/157057
PCT Pub. Date: Oct. 24, 2013

(65) Prior Publication Data
US 2015/0275371 A1    Oct. 1, 2015

(30) Foreign Application Priority Data

Apr. 18, 2012  (JP) .................................. 2012-094677

(51) Int. Cl.
*H01L 21/44* (2006.01)
*C23C 16/52* (2006.01)
*C30B 25/02* (2006.01)
(Continued)

(52) U.S. Cl.
CPC ............... *C23C 16/52* (2013.01); *C23C 16/303* (2013.01); *C23C 16/4557* (2013.01);
(Continued)

(58) Field of Classification Search
CPC ................. H01L 21/02241; H01L 21/7607; H01L 21/02271; H01L 21/0262; H01L 21/02126; H01L 21/3062; H01L 21/28556; H01L 21/31683; H01L 23/345; H01L 23/3737; H01L 23/296; H01L 45/1616; C23C 16/453; C23C 16/277; C23C 23/06
USPC .......... 438/681, 680, 510, 513, 602, 603, 604, 438/905, 913; 257/200, 201, 721, E21.006, 257/E21.007, E21.077, E21.109, E21.134, 257/E21.16, E21.17, E21.126, E21.127, 257/E21.311, E21.319, E21.333, E21.441
See application file for complete search history.

(56) References Cited

U.S. PATENT DOCUMENTS 5,803,974 A * 9/1998 Mikoshiba et al. .... 118/723 MP
6,645,302 B2 * 11/2003 Udagawa ....................... 118/715
(Continued)

FOREIGN PATENT DOCUMENTS

CN      101925980 A    12/2010
EP      2 312 650       4/2011
(Continued)

OTHER PUBLICATIONS

International Search Report dated Oct. 1, 2013, Application No. PCT/JP2012/004466.
(Continued)

*Primary Examiner* — David Nhu
(74) *Attorney, Agent, or Firm* — Rankin, Hill & Clark LLP

(57) ABSTRACT

A vapor deposition apparatus includes a deposition chamber for carrying out a deposition of a film on a substrate, source gas tubes for supplying a source gas, a transfer unit for transferring the substrate in the interior of the deposition chamber so that the substrate is alternately situated in a state where the substrate is located in a deposition region that faces the gas discharge port for supplying the source gas and in a state where the substrate is located in other region except the deposition region, while the source gas is supplied from a gas discharge port of any one of the source gas tubes, and a supply tube for supplying a gas containing group-V element to the substrate S located in the other region.

12 Claims, 6 Drawing Sheets

(51) Int. Cl.
*C23C 16/30* (2006.01)
*C30B 29/40* (2006.01)
*C23C 16/455* (2006.01)
*C23C 16/458* (2006.01)
*H01L 21/02* (2006.01)

(52) U.S. Cl.
CPC ...... *C23C 16/4584* (2013.01); *C23C 16/45551* (2013.01); *C23C 16/45565* (2013.01); *C23C 16/45574* (2013.01); *C30B 25/02* (2013.01); *C30B 29/40* (2013.01); *C30B 29/403* (2013.01); *C30B 29/406* (2013.01); *H01L 21/0262* (2013.01); *H01L 21/02538* (2013.01)

(56) References Cited

U.S. PATENT DOCUMENTS

| | | | |
|---|---|---|---|
| 6,902,620 | B1 | 6/2005 | Omstead et al. |
| 8,143,147 | B1 | 3/2012 | Kraus et al. |
| 2004/0187784 | A1 | 9/2004 | Sferlazzo |
| 2008/0096369 | A1 | 4/2008 | Strzyzewski et al. |
| 2009/0117272 | A1 | 5/2009 | Behres |
| 2009/0194024 | A1 | 8/2009 | Stevens |
| 2011/0083735 | A1 | 4/2011 | Park et al. |
| 2011/0236598 | A1 | 9/2011 | Kumagai et al. |
| 2013/0149808 | A1 | 6/2013 | Park et al. |

FOREIGN PATENT DOCUMENTS

| | | |
|---|---|---|
| JP | 2003-142404 | 5/2003 |
| JP | 2011-114196 | 6/2011 |
| WO | 2006/088463 | 8/2006 |

OTHER PUBLICATIONS

Chinese Office Action dated Aug. 12, 2015 issued in the corresponding Chinese patent application No. 201280072509.6 and English translation thereof.

* cited by examiner

VAPOR DEPOSITION APPARATUS AND METHOD ASSOCIATED

This application is a National Phase Application of International Application No. PCT/JP2012/004466, filed Jul. 11, 2012, which claims the priority of Japan Patent Application No. 2012-094677, filed Apr. 18, 2012. The present application claims priority from both applications and each of these applications is herein incorporated in their entirety by reference.

TECHNICAL FIELD

The present invention relates to a vapor deposition apparatus and a method for depositing film.

BACKGROUND ART

Migration enhanced epitaxy (MEE) is actively examined as a process for achieving enhanced crystallinity of a semiconductor layer made of a group III-V compound in recent years (see, for example, Japanese Patent Laid-Open No. 2003-142,404: hereinafter referred to as Document 1).

Such MEE is a process that promotes an acceleration of a surface diffusion of atoms of a III-group element, and involves, for example, alternately conducting a supply of atoms of a group-III element and a supply of atoms of a group-V element. The alternative supply of atoms of different elements results in the situation, in which atoms of a group-V element is not supplied when atoms of a group-III element is supplied, so that pressure exerted to atoms of a group-III element is reduced and a surface diffusion of atoms of a group-III element is activated. This allows that atoms of a group-III element, which has been adsorbed to a growth surface, is diffused over the surface, reaching to kinks and steps formed on the growth surface. It is described that the crystalline growth in this way results in obtaining improved crystal that is derived from the crystallinity of the underlying layer.

CITATION LIST

Patent Literature

[PTL 1] Japanese Patent Laid-Open No. 2003-142,404

SUMMARY OF INVENTION

Conventionally, the above-described MEE has been conducted mainly in molecular beam epitaxy (MBE), as described in Japanese Patent Laid-Open No. 2003-142,404. It is considered that the MEE (often referred to alternatively as flow modulation epitaxy [FME]) requires complicated tasks when the MEE is carried out in the metal organic chemical vapor deposition (MOCVD) or in the hydride vapor phase epitaxy (HVPE). This will be described in reference to FIG. 9, which shows a conventional MOCVD apparatus. A substrate S is, at first, disposed on a susceptor 91 in a reaction tube when the implementation of the MEE is started in such apparatus. Then, a supply of trimethylgallium (TMG) from a gas introduction tube 93 and a supply of ammonia ($NH_3$) gas from a gas introduction tube 94 are alternately conducted. Such process requires consecutive conductions of the supply of trimethylgallium from the gas introduction tube 93 and the stop of trimethylgallium, which require considerable time and complicated tasks. Therefore, it is, in reality, extremely difficult in the conventional process to obtain a desirable thickness of a film through the MEE in the MOCVD or in the HVPE, and thus it is difficult to obtain a semiconductor film of a III-V compound having better crystallinity by conducting MEE.

The present invention is proposed on the basis of the considerations for the above-described problems. More specifically, according to one aspect of the present invention, there is provided a vapor deposition apparatus for depositing a film of a III-V compound semiconductor on a substrate, comprising: a deposition chamber for depositing the film on the substrate; a source gas tube for supplying a source gas in the deposition chamber, the source gas containing a gas containing a group-III element and a reactive gas containing group-V element, which is capable of being reacted with the gas containing group-III element to deposit the film; a transfer unit for transferring the substrate in the interior of the deposition chamber so that the substrate is situated alternately in a facing-state and in an other-state while the source gas is supplied from a discharge port of the source gas tube, the facing-state being a state where the substrate is located in a deposition region that faces the discharge port for supplying the source gas, and the other-state being a state where the substrate is located in other region except the deposition region; and a supply tube for supplying a gas containing a group-V element to the substrate located in the other region.

According to the above-described aspect of the present invention, the substrate can be transferred within the deposition chamber so that the substrate is alternately situated in a state where the substrate is located in a deposition region that faces the discharge port for supplying the source gas and in a state where the substrate is located in other region except the deposition region, while the source gas is supplied from the discharge port of the source gas tube. This allows alternately conducting the operation for supplying the source gas over the surface of the substrate and the operation without supplying the source gas for a single substrate. The process without supplying the source gas allows accelerating a diffusion of the group-III element serving as the raw material, such that the III-V compound semiconductor film with improved crystallinity can be obtained.

In addition to above, the vapor deposition apparatus according to the present invention comprises a supply tube for supplying a gas containing a group-V element for the substrate located in other region that is outside of the deposition region. The supply of the gas containing a group-V element from the supply tube can provide a certain level of pressure to atoms of the group-V element under a condition where a source gas is not supplied, so that an elimination of atoms of the group-V element from the surface of the substrate can be prevented.

Further, according to the present invention, a process for depositing films can also be provided. More specifically, according to another aspect of the present invention, there is provided a process for depositing a film of a III-V compound semiconductor on a substrate by a vapor deposition, including: depositing a III-V compound semiconductor film on the substrate with a source gas containing a gas containing a group-III element and a reactive gas containing group-V element that is capable of reacting with the gas containing group-III element, wherein the substrate is moved in an interior of a deposition chamber so that the substrate is situated alternately in a facing-state and in an other-state while the source gas is supplied to the interior of the deposition chamber from a source gas tube, the facing-state being a state where the substrate is located in a deposition region that faces a discharge port of the source gas tube, and the other-state being a state where the substrate is located in other region except the deposition region, and wherein the depositing the semiconductor film includes supplying a gas containing a group-V element to the substrate located in other region except the deposition region, while the source gas is supplied in the deposition chamber from the source gas tube. The above-described advantageous effects can also be obtained in the present process for depositing film.

According to the present invention, the vapor deposition apparatus and the process for depositing films, which provide the III-V group semiconductor film with improved crystallinity, can be provided.

DESCRIPTION OF EMBODIMENTS

Figure 1:
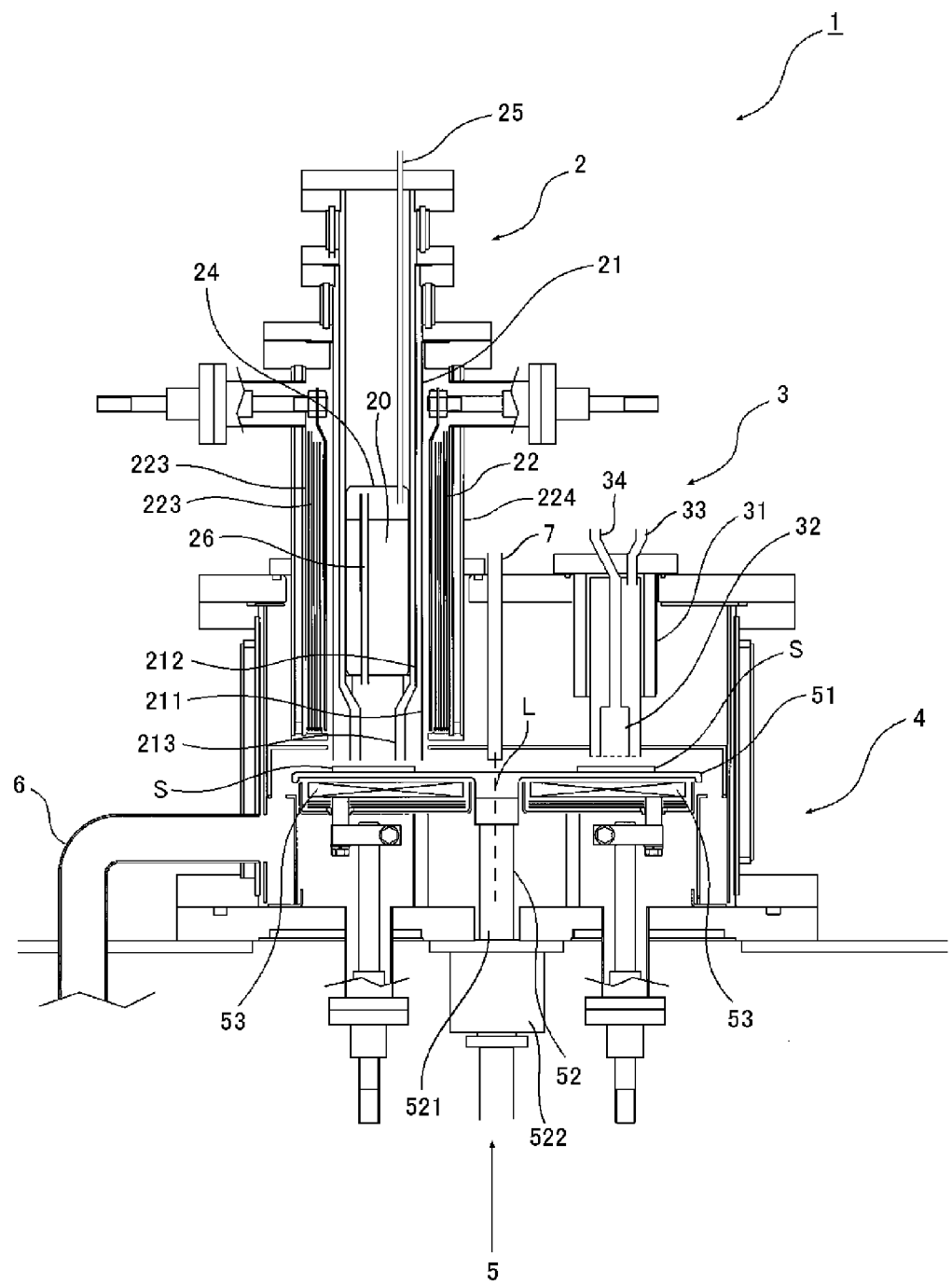
FIG. 1 is a cross-sectional view, illustrating a vapor deposition apparatus according to the present invention.
Figure 2:
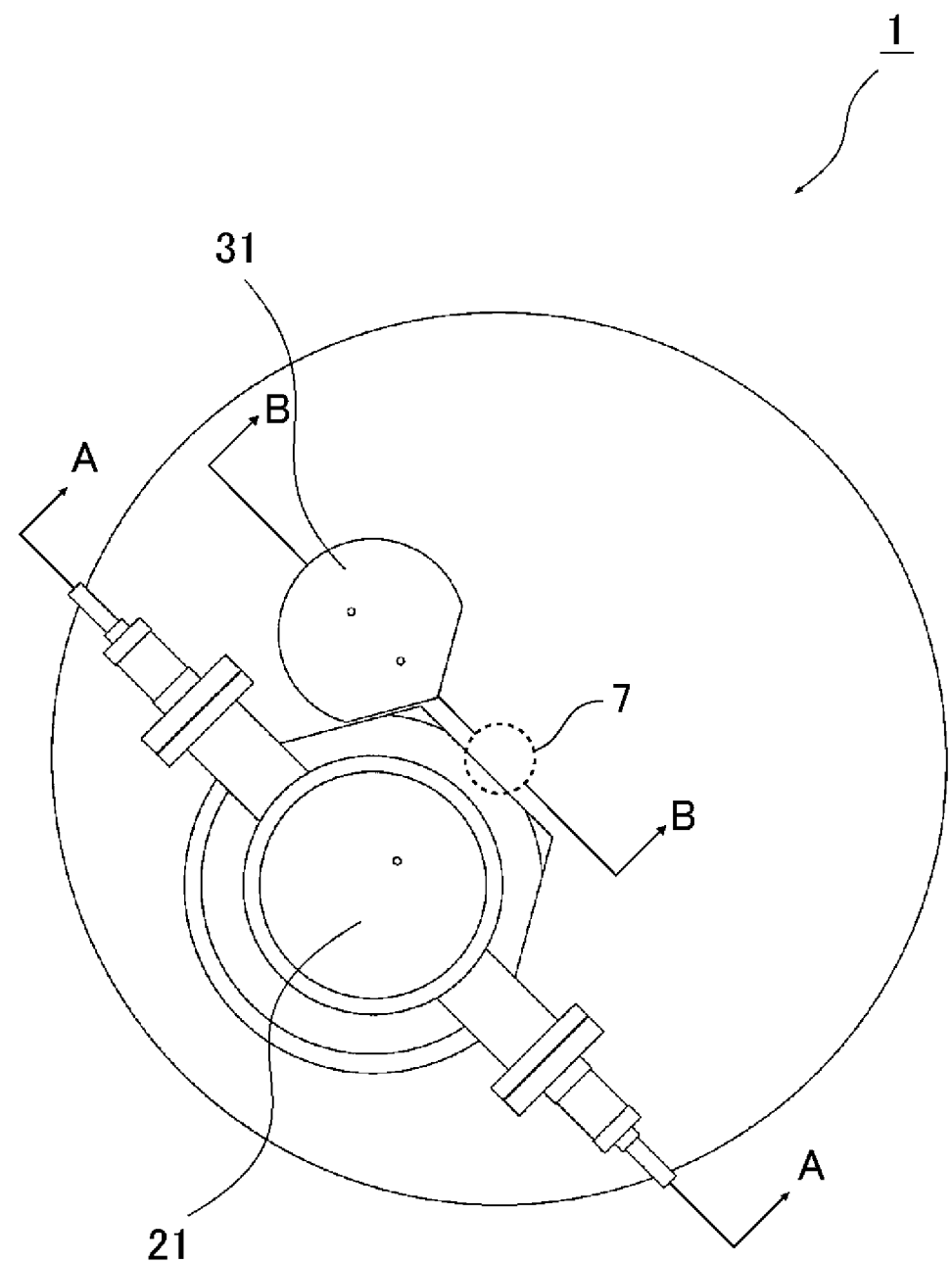
FIG. 2 is a plan view of the vapor deposition apparatus shown in FIG. 1.
Figure 3:
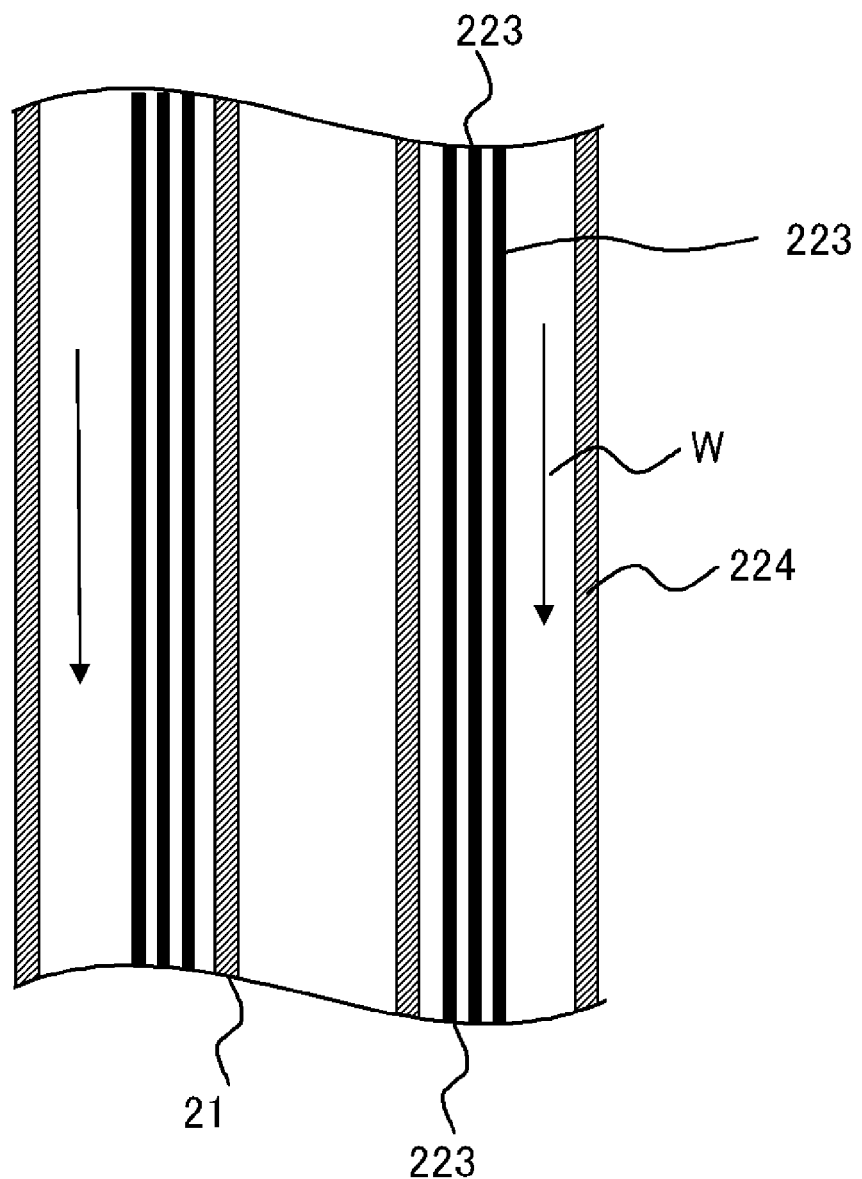
FIG. 3 is a schematic diagram, illustrating a part of the vapor deposition apparatus shown in FIG. 1.

Exemplary implementations according to the present invention will be described in detail as follows in reference to the annexed figures. In all figures, an identical numeral is assigned to an element commonly appeared in the figures, and the detailed description thereof will not be repeated. In the beginning, an overview of a vapor deposition apparatus 1 of the present embodiment will be described in reference to FIG. 1 to FIG. 7. The vapor deposition apparatus 1 of the present embodiment is an apparatus for depositing a film of a III-V compound semiconductor on a substrate S, and more specifically an apparatus for forming a III-V compound semiconductor film by a chemical vapor deposition process. The vapor deposition apparatus 1 includes, as shown in FIG. 1, a deposition chamber 4 for carrying out a deposition of a film on the substrate S, source gas tubes 21 and 31 for supplying a source gas containing a gas containing a group-III element and a reactive gas containing a group-V element that is capable of reacting with the gas containing a group-III element into the deposition chamber 4, respectively, a transfer unit 5 for transferring the substrate S in the interior of the deposition chamber 4 so that the substrate S is alternately situated in a facing-state where the substrate is located in a deposition region that faces the discharge port for supplying the source gas and in an other-state where the substrate is located in other region except the deposition region, while the source gas is supplied from a discharge port of any one of the source gas tubes 21 and 31, and a supply tube 7 for supplying a gas containing a group-V element to the substrate S located in the other region.

Here, typical group-III element includes one or more of gallium (Ga), aluminum (Al), indium (In) and boron (B).

Typical group-V element includes one or more of nitrogen (N), arsenic (As) and phosphorus (P). Further, typical III-V compounds for the III-V compound semiconductor film includes any one of gallium nitride (GaN), aluminum nitride (AlN), indium nitride (InN), boron nitride (BN), and ternary compounds such as GaAlN, InGaN, GaBN, AlBN, InBN, GaNAs, InNAs, AlNAs and BNAs, or a mixed crystal thereof. Typical, and non-limiting, example of the substrate S includes, for example, sapphire substrate, silicon carbide (SiC) substrate, zinc oxide (ZnO) substrate and silicon substrate. Further, the typical, and non-limiting, size of the substrate S may be for example, 2 to 6 inches. In addition to above, in the following embodiments, nitrogen is exemplified as group-V element and Ga is exemplified as group-III element, and exemplary implementations for producing a GaN film will be shown. However, the vapor deposition apparatus 1 of the present invention may also be used for producing films of III-V compound semiconductor other than GaN. For example, when GaAlN is produced, an Al source may be disposed in the inside of a second inner tube 213 of a hydride deposition gas-supplying unit (gas-supplying unit for hydride vapor phase deposition) 2, in addition to disposing a Ga source. Further, in an organometallic deposition gas-supplying unit (gas-supplying unit for metal organic chemical vapor deposition) 3, trimethylaluminum may additionally be supplied, in addition to supplying trimethylgallium.

Next, the vapor deposition apparatus 1 of the present embodiment will be described in detail. The following description will be made in reference to FIG. 1. FIG. 1 is a "displacement" cross-sectional view, in which the direction along line A-A in plan view of FIG. 2 coincides with the cross section along the direction of line B-B. The vapor deposition apparatus 1 includes the deposition chamber 4, the hydride deposition gas-supplying unit 2, the organometallic deposition gas-supplying unit 3, the transfer unit 5, and the supply tube 7.

The hydride deposition gas-supplying unit 2 functions for conducting a hydride vapor phase deposition in the deposition chamber 4. The hydride deposition gas-supplying unit 2 includes a first source gas tube (gas tube for the hydride vapor phase deposition) 21 and a thermal barrier unit 22 disposed outside of the first source gas tube 21. The first source gas tube 21 functions as discharging a first source gas containing a gas containing a halogen and a group-III element and a reactive gas containing a group-V element toward the substrate S. The first source gas tube 21 is configured to have three tubes (an outer tube 211, a first inner tube 212 and a second inner tube 213).

The outer tube 211 is a tube for supplying the reactive gas into the deposition chamber 4. The reactive gas is a gas containing a group-V element. Further, the reactive gas is also a gas for depositing a film on the substrate S by reacting with the gas containing a halogen and a group-III element as described above. In the present embodiment, the outer tube 211 supplies an ammonia gas that serves as a reactive gas in the deposition chamber 4.

The first inner tube 212 has a diameter, which is smaller than the diameter of the outer tube 211, and thus is inserted in the outer tube 211. A non-reactive gas is supplied within the first inner tube 212. Such non-reactive gas is a gas, which is non-reactive with both of the reactive gas and the gas containing the halogen and the group-III element. Typical non-reactive gas includes, for example, hydrogen gas.

The second inner tube 213 has a diameter, which is smaller than the diameter of the first inner tube 212, and thus is inserted in the first inner tube 212. The gas containing the halogen and the group-III element is supplied into the deposition chamber 4 through the second inner tube 213. Such gas containing the halogen and the group-III element is a gas, which is reacted with the reactive gas exhausted from the outer tube 211 to deposit a film on the substrate S. It is preferable that such gas containing the halogen and the group-III element is a gas containing halogenated compounds (halides) of the group-III elemental, and typically, for example, gallium chloride (GaCl) gas. The inside of the second inner tube 213 is provided with a source of a raw material for the gas containing the halogen and the group-III element, typically, for example, a container (source boat) 24 retaining a raw material 20 contain group-III element (for example, Ga).

A duct 25 and a duct 26 are coupled to such container 24. A gas for generating the gas containing the halogen and the group-III element (a gas containing halogen, and for example, hydrogen chloride (HCl) gas) is supplied in the container 24 though the duct 25, and then is reacted with the raw material 20 in the container 24 to create the gas containing the halogen and the group-III element (for example, gallium chloride (GaCl) gas). Thus created gas containing the halogen and the group-III element is exhausted from the duct 26 and then is supplied into the deposition chamber 4 through the discharge port of the second inner tube 213. Alternatively, the gas containing the halogen and the group-III element may be supplied from the outer tube 211 and the reactive gas may be supplied from the second inner tube 213.

The position corresponding to a circumference of the first source gas tube 21, in particular, a circumference of the container 24 is provided with a heating unit for heating the inside of the first source gas tube 21, for example, a heater (not shown). Further, a thermal barrier unit 22 is disposed in a circumference (outer circumference) of such heater. In the present embodiment, the thermal barrier unit 22 is configured to include a plurality of tubular metallic members 223 provided so as to surround the circumference of the first source gas tube 21, in particular, the circumference of the container 24, and a cooling unit 224 disposed in the periphery of such metallic members 223. The metallic members 223 are, for example, pipes having a triplet structure. The periphery of the metallic member 223 is provided with the tube that composes the cooling unit 224, and a cooling fluid W (for example, a liquid such as water) flows in the interior of such tube to achieve thermal insulation from the heat created in the heating unit (see the schematic diagram of FIG. 3).

Meanwhile, the organometallic deposition gas-supplying unit 3 serves as conducting the metal organic chemical vapor deposition in the deposition chamber 4. Such organometallic deposition gas-supplying unit 3 includes the second source gas tube (gas tube for metal organic chemical vapor deposition) 31 for supplying the second source gas containing organic metal and the reactive gas for reacting with such gas to the substrate S disposed in the deposition chamber 4. A duct 34 and a duct 33 are coupled to such second source gas tube 31. The duct 34 serves for supplying the gas containing organic metal, and the duct 33 serves for supplying the reactive gas. The discharge port of the second source gas tube 31 is provided with a shower head 32 serving as a gas-supplying unit including a plurality of holes attached thereto, and the gas containing organic metal and the reactive gas for reacting with such gas is supplied in the deposition chamber 4 through the holes of such shower head 32. The gas containing organic metal is an organometallic gas containing the group-III element, and typical gas containing organic metal includes, for example, an organometallic gas such as trimethylgallium or the like. On the other hand, typical example of the reactive gas includes, for example, a gas containing the group-V element, for example, ammonia or the like. The gas containing organic metal and the reactive gas are separately supplied to the interior of the deposition chamber 4 through different holes of the shower head 32.

The deposition chamber 4 is configured of a chamber made of, for example, stainless steel or the like. The transfer unit 5 for supporting the substrate S is disposed in the interior of such deposition chamber 4. Such transfer unit 5 includes a susceptor 51 for supporting the substrate S and a driving unit 52 for providing a rotary drive of the susceptor 51. The susceptor 51 is in a form of a disc, and support the substrate S on one side face (front surface). The face of susceptor 51 for supporting the substrate is the face situated perpendicular to the rotation axis L of the susceptor 51 and also the face situated opposite to the face that is coupled to the driving unit 52. The substrate S is supported so that the front surface of the substrate is oriented toward the side of the source gas tubes 21 and 31. In other words, the substrate S is disposed so that the front surface of the substrate S is perpendicular to the direction of the supply of the gas from the source gas tubes 21 and 31. In the present embodiment, the susceptor 51 supports a plurality of substrates S, and these substrates S are arranged along a circle having a center, which coincide with the rotation axis of the susceptor 51.

Figure 4:
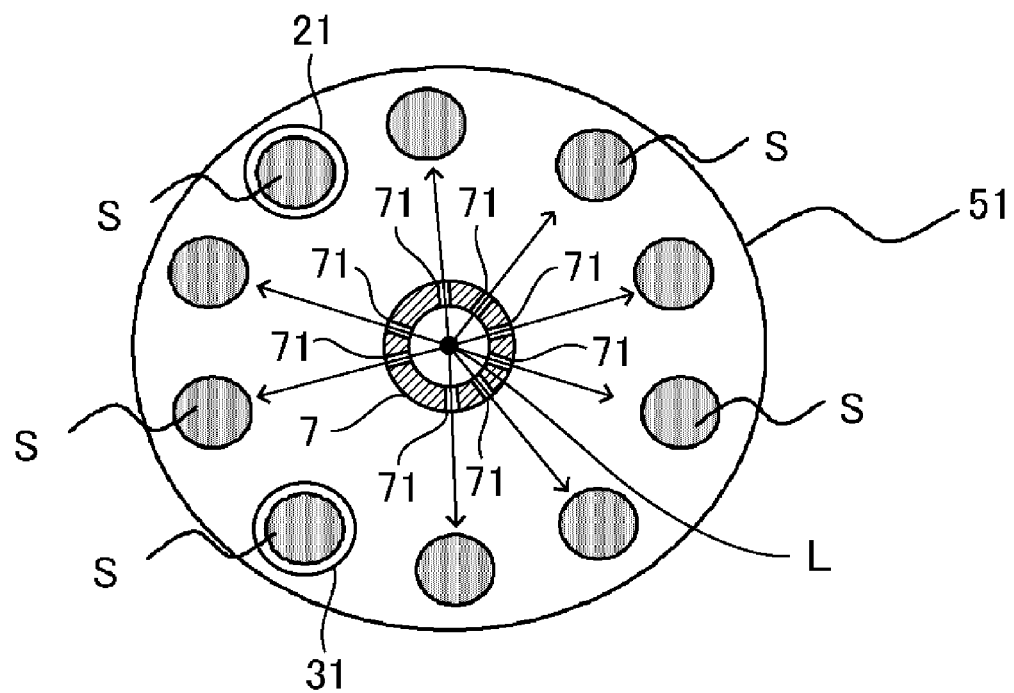
FIG. 4 is a plan view, illustrating another part of the vapor deposition apparatus shown in FIG. 1.

The driving unit 52 is coupled to the susceptor 51. The driving unit 52 includes a shaft 521 that supports the susceptor 51 from the side of the back surface thereof, and a motor 522 coupled to such shaft 521. The motor 522 is actuated to cause a rotary drive of the shaft 521 around the center of the rotation axis L. In a plan view viewed from the direction along the rotation axis L of the susceptor 51, a gas discharge port of the first source gas tube 21 to the deposition chamber 4 and a gas discharge port of the second source gas tube 31 to the deposition chamber 4 are arranged along the circular trance of the substrate S moved by the rotary drive of the susceptor 51 (see FIG. 4). Here, FIG. 4 is a plan view of the vapor deposition apparatus 1, and provides an illustration of the susceptor 51 viewed from the side of the first source gas tube 21 and the second source gas tube 31. Here, the susceptor 51 itself is to rotate around its center by the driving unit 52. The substrates S supported by the susceptor 51, in turn, move along a single circle having a center, which coincides with the rotation axis L of the susceptor 51, and thus revolves around the center of the rotation axis L of the susceptor 51. The revolution of the substrates S around the center of the rotation axis L of the susceptor 51 provides that a substrate S is alternately situated in the following two states:

(1) a facing-state, in which the substrate S faces the discharge port of the first source gas tube 21, from which the first source gas is discharged, or faces the discharge port of the second source gas tube 31, from which the second source gas is discharged, and the substrate S is located in a deposition region right under the discharge port; and (2) an other-state, in which the substrate S is located in other region (non-deposition region) out of the deposition region.

Further description will made in detail in reference to FIG. 4 that the susceptor 51 supporting the substrates S is rotated so that the substrate S located in the deposition region right under the discharge port of the first source gas tube 21 or the discharge port of the second source gas tube 31 starts to move along the circle having its center on that coincide with the rotation axis L. The substrate S is, then, transferred to other region out of the deposition region. In such other region, almost no source gas from the first source gas tube 21 or from the second source gas tube 31 is supplied to the substrate S. Then, the rotation of the susceptor 51 continues to cause that the substrate S is transferred again to the deposition region right under the discharge port of the first source gas tube 21 or the discharge port of the second source gas tube 31. Such cycle is repeated to achieve a deposition of a film on the substrate S.

In addition, when the substrate S supported by the susceptor 51 is disposed so as to face the discharge port of the first source gas tube 21 as shown in FIG. 4, the diameter of the discharge port of the first source gas tube 21 is slightly larger than the diameter of the substrate S, and accordingly, it is configured that a single piece of the substrate S is fitted into the discharge port in a plan view viewed from the upper side of the apparatus (plan view viewed from the side of the first source gas tube 21). However, while a single piece of the substrate S is fitted into the discharge port in plan view from the upper side, all of the substrates S supported by the susceptor 51 cannot be fitted into the single discharge port. While a single piece of the substrate S is fitted in a single discharge port in plan view from the upper side, a plurality of substrates S are not fitted therein, in the present embodiment.

Similarly, when the substrate S supported by the susceptor 51 is disposed so as to face the discharge port of the second source gas tube 31, the diameter of the discharge port of the second source gas tube 31 is slightly larger than the diameter of the substrate S, and accordingly, it is configured that a single piece of the substrate S is fitted into the discharge port in a plan view viewed from the upper side. However, while a single piece of the substrate S is fitted into the discharge port in plan view from the upper side, all of the substrates S supported by the susceptor 51 cannot be fitted into the single discharge port. While a single piece of the substrate S is fitted in a single discharge port in plan view from the upper side, a plurality of substrates S are not fitted therein, in the present embodiment. In addition to above, as shown in FIG. 1, a plurality of heaters 53 serving as heating units are disposed in the back side of the susceptor 51. Each of these heaters 53 heats each of the substrates S from the back side during the deposition process.

Further, a duct 6 for exhausting the gas from the deposition chamber 4 is connected to the deposition chamber 4.

In addition, a supply tube 7 is also connected to the deposition chamber 4. The tip section of the supply tube 7 is inserted in the interior of the chamber. Such supply tube 7 is for supplying a gas containing the group-V element over the substrate S located in the above-described other region in the deposition chamber 4. Here, it is sufficient that the gas containing the group-V element may contain the group-V element contained in the above-described reactive gas, and typically a gas of, for example, one or more of ammonia, nitrogen, and hydrazine. Among these, ammonia gas is preferable, in view of better degradability. Alternatively, when the group-V element contained in the reactive gas supplied from the hydride deposition gas-supplying unit 2 is different from the group-V element contained in the reactive gas supplied from the organometallic deposition gas-supplying unit 3, a gas containing the group-V element, which is contained in the reactive gas supplied from any of the gas-supplying unit in operation (in the deposition process), is supplied from the supply tube 7.

Figure 5:
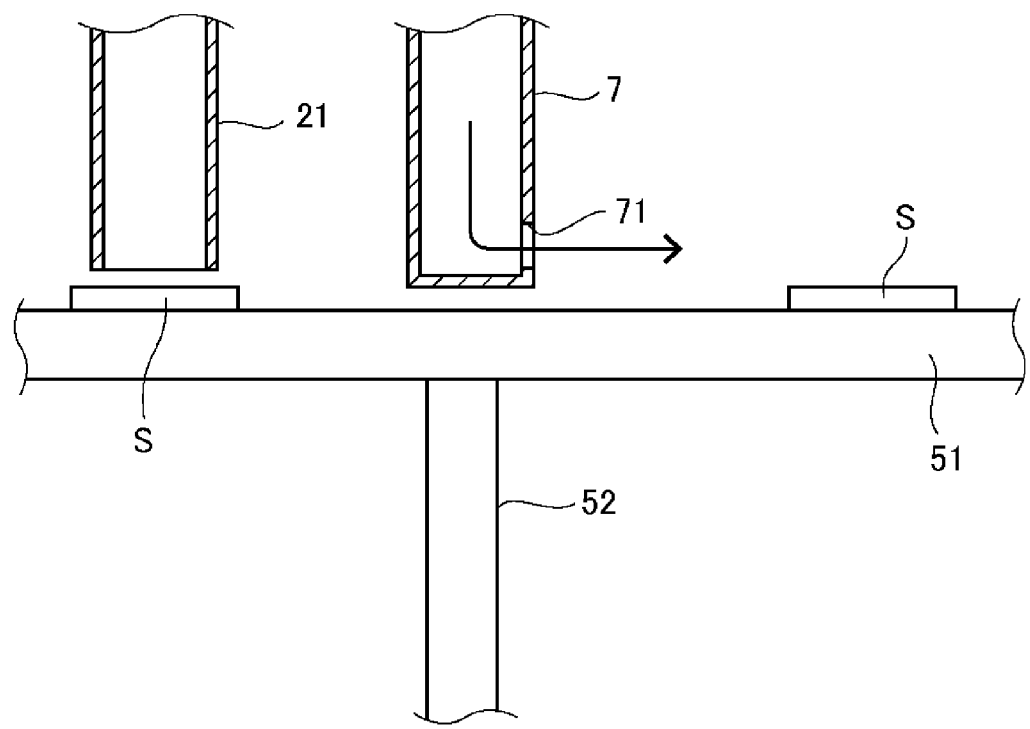
FIG. 5 is a cross-sectional view, illustrating yet other part of the vapor deposition apparatus shown in FIG. 1.

As shown in FIGS. 1, 4 and 5, at least tip section of such supply tube 7 is extended in parallel with the rotation axis L. In the present embodiment, the supply tube 7 is elongated on the rotation axis L. In addition, the supply tube 7 is disposed in the inside of the circular trance of the substrate S revolving around the periphery of the rotating shaft L in a plan view viewed from the direction along the rotation axis L. In addition, the tip section of the supply tube 7 is extended in parallel with the first source gas tube 21 and the second source gas tube 31, and also is extended vertically.

Such supply tube 7 is configured to supply a gas containing the group-III element toward other regions except the above-described deposition region right under the discharge port of the first source gas tube 21 and the deposition region right under the second source gas tube 31, as shown in FIG. 4 and FIG. 5.

More specifically, the side surface of the tip section of the supply tube 7 located in the inside of the deposition chamber 4 is provided with a plurality of holes 71 formed therein, and a gas is discharged through these holes. This allows a discharge of the gas from the supply tube 7 radially in the deposition chamber 4. Here, the holes 71 are arranged in the side surface of the tip of the supply tube 7 so that each of the holes is spaced apart from each other along the circumference direction of the supply tube 7. However, such holes 71 are not disposed on a straight line through the center of the discharge port of the first source gas tube 21 and the center of the supply tube 7 (axis of the supply tube 7, which coincides with the rotation axis L in this case) and not disposed on a straight line through the center of the second source gas tube 31 and the central of the supply tube 7 as shown in FIG. 4, in a plan view viewed from the rotation axis L direction.

The gas is discharged from the respective holes 71 of the supply tube 7 toward the direction perpendicular to the extending orientation of the supply tube 7. More specifically, the gas is discharged from the respective holes 71 of the supply tube 7 toward the upper side of the front surface of the substrate S revolving around the rotation axis L. In addition to above, the surface of the tip of the supply tube 7 is closed, and the gas is not discharged from the surface of the tip. While the holes 71 are arranged in the side surface of the tip of the supply tube 7 so that each of the holes is spaced apart from each other along the circumference direction of the supply tube 7 in the present embodiment, the height of each of the holes 71 from the tip of the source gas tube may be the same, or may be different. However, it is preferable to design that the height of each of the holes 71 from the tip of the source gas tube is the same, in view of maintaining uniformity in the density distribution of the gas over the surface of the substrate S.

Figure 6:
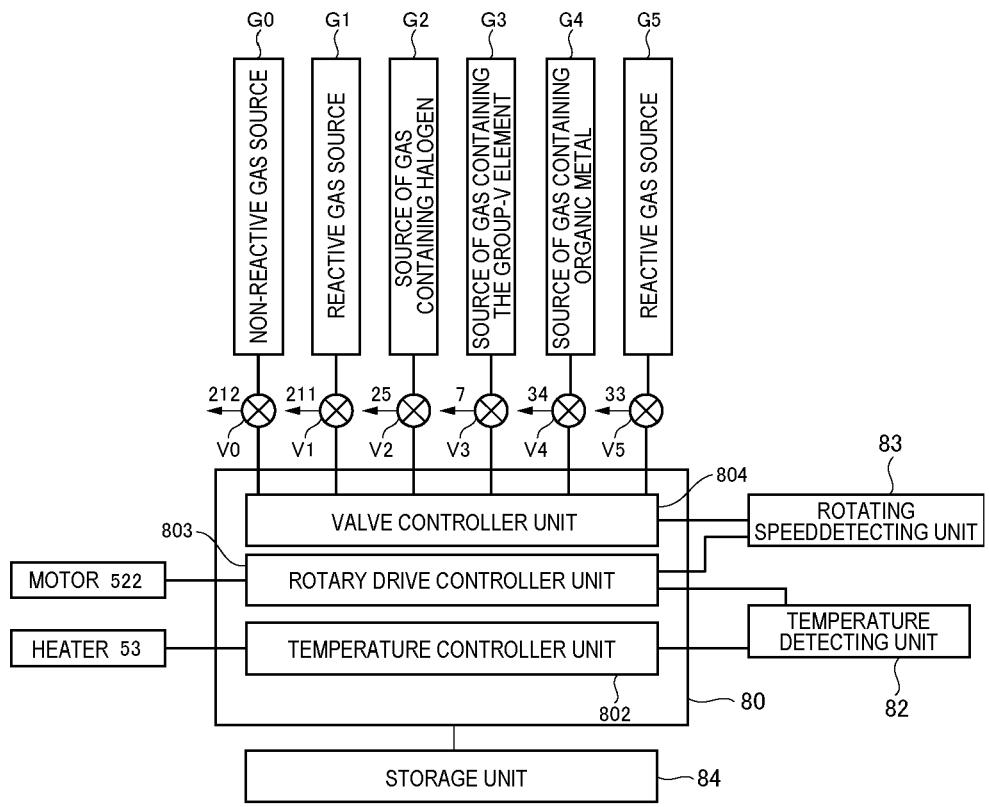
FIG. 6 is a block diagram of the vapor deposition apparatus shown in FIG. 1.

Further, such vapor deposition apparatus 1 includes, as shown in FIG. 6, a controller unit 80, a temperature detecting unit 82, a rotating speed detecting unit 83, a storage unit 84, valves V0 to V5, and various types of gas sources G0 to G5. The temperature detecting unit 82 serves as detecting a temperature of the substrate S in the deposition chamber 4. The typical temperature detecting unit 82 is, for example, an infrared detection apparatus, which can measure the intensity of infrared ray emitted from the surface of the substrate S to determine the surface temperature of the substrate S. The rotating speed detecting unit 83 serves as detecting a rotating speed of the shaft 521, and is generally composed of, for example, an encoder, an electromagnetic rotation detector, a photoelectric rotation detector or the like, and is typically installed in the power shaft of the motor 522 to detect a rotating speed of the shaft 521.

The controller unit 80 comprises a temperature controller unit 802, a rotary drive controller unit 803, and a valve control section 804. The temperature controller unit 802 serves as controlling the temperature of the surface of the substrate S, and provides a control for the activation of the heater 53. The rotary drive controller unit 803 serves as controlling a rotating speed of the shaft 521, and provide a control of the activation of the motor 522. The valve controller unit 804 controls the open and the close of the valves V0 to V5, and also controls the flow rate of the supplied gas from the respective tubes.

Here, a first inner tube 212 of the hydride deposition gas-supplying unit 2 is coupled to the valve V0. In addition, a non-reactive gas source G0 is coupled to the valve V0. The valve V0 is opened to cause a supply of the non-reactive gas into the first inner tube 212 from the non-reactive gas source G0. In addition, an outer tube 211 of the hydride deposition gas-supplying unit 2 is coupled to the valve V1. In addition, a reactive gas source G1 is coupled to the valve V1. The valve V1 is opened to cause a supply of a reactive gas into the outer tube 211 from the reactive gas source G1. Further, a duct 25 of the hydride deposition gas-supplying unit 2 is coupled to the valve V2. In addition, a source G2 of a gas containing halogen is coupled to the valve V2.

The valve V2 is opened to cause a supply of the gas containing halogen into the duct 25 from the source G2 of the gas containing halogen. Here, the gas sources G0 to G2 compose the hydride deposition gas-supplying unit 2.

In addition, the valve V3 is coupled to the supply tube 7 and is also coupled to the source G3 of the gas containing the group-V element. The valve V3 is opened to cause a supply of the gas containing the group-V element into the supply tube 7 from the source G3 of the gas containing the group-V element.

In addition, a source G4 of a gas containing organic metal is coupled to the valve V4. Further, a duct 34 of the organometallic deposition gas-supplying unit 3 is also coupled to the valve V4. The valve V4 is opened to cause a supply of the gas containing organic metal into the duct 34 from the source G4 of the gas containing organic metal. Further, a reactive gas source G5 is coupled to the valve V5. Further, a duct 33 of the organometallic deposition gas-supplying unit 3 is coupled to the valve V5. The valve V5 is opened to cause a supply of a reactive gas into the duct 33 from the reactive gas source G5. Here, the gas sources G4 to G5 compose the organometallic deposition gas-supplying unit 3.

The quantities (flow rates) of the respective supplied gases per unit time during the hydride vapor phase deposition process; the temperature of the substrate S; the temperature of the inside of the first source gas tube 21; and the rotating speed of the shaft 521, are stored in the storage unit 84. Further, the storage unit 84 stores: the flow rates of the respective gases during the process for the metal organic chemical vapor phase deposition; the temperature of the substrate S; and the rotating speed of the shaft 521. In other words, the flow rates of the respective gases, the temperature of the substrate S, the temperature of the inside of the first source gas tube 21 and the rotating speed of shaft 521 are stored associated with the type information of the deposition gas-supplying unit (the vapor deposition type information) in the storage unit 84.

However, the flow rate of the gas from the supply tube 7 stored associated with the type information of the hydride vapor phase deposition is different from the flow rate of the gas from the supply tube 7 stored associated with the type information of the metal organic chemical vapor phase deposition. Further, the temperature of the substrate S stored associated with the type information of the hydride vapor phase deposition is different from the temperature of the substrate S stored associated with the type information of the metal organic chemical vapor phase deposition. In addition, the rotating speed of the shaft 521 stored associated with the type information of the hydride vapor phase deposition may be the same as, or be different from, the rotating speed of the shaft 521 stored associated with the type information of the metal organic chemical vapor phase deposition.

Next, the process for depositing films of the III-V compound semiconductor by employing the vapor deposition apparatus 1 as described above will be described. Firstly, a plurality of substrates S are disposed on the susceptor 51. Next, an operator enters a signal (activation request signal) for requesting a start of an activation of the hydride deposition gas-supplying unit 2 to the vapor deposition apparatus 1. The temperature controller unit 802 receives the activation request signal. Then, the temperature controller unit 802 retrieves the temperature of the substrate S stored associated with the type information of the deposition gas-supplying unit, the activation of which is requested, from the storage unit 84 on the basis of the activation request signal. Then, the temperature controller unit 802 activates the heater 53 to heat the substrate S up to the predetermined temperature stored in the storage unit 84. On the other hand, the temperature detecting unit 82, which received the activation request signal, detects the surface temperature of the substrate S. The temperature controller unit 802 determines whether or not the temperature of the surface of the substrate S detected with the temperature detecting unit 82 reaches to the predetermined temperature stored in the storage unit 84 (1,040 degrees C., for example), and the activation of the heater 53 is controlled so as to reach to the predetermined temperature.

Further, when the operator enters the signal (activation request signal) for requesting the start of the activation of the hydride deposition gas-supplying unit 2 to the vapor deposition apparatus 1 in the present embodiment, a second temperature controller unit, which is not shown here, receives the activation request signal. Then, the second temperature controller unit retrieves the temperature of the first source gas tube 21 stored associated with the type information of the deposition gas-supplying unit, the activation of which is requested, from the storage unit 84 on the basis of the activation request signal. Then, the second temperature controller unit activates a heating unit, which is not shown here, to heat the first source gas tube 21 to the predetermined temperature stored in the storage unit 84. On the other hand, the temperature of the first source gas tube 21 is detected by a second temperature detecting unit, which is not shown here and received an activation request signal. The second temperature controller unit determines whether or not the temperature of the first source gas tube 21 detected with the second temperature detecting unit reaches to the predetermined temperature stored in the storage unit 84 (850 degrees C., for example), and the activation of the second heating unit is controlled so as to reach to the predetermined temperature.

The rotary drive controller unit 803 determines whether or not the temperature of the surface of the substrate S detected with the temperature detecting unit 82 reaches to the predetermined temperature, and further determines whether or not the temperature of the inside of the first source gas tube 21 detected with the second temperature detecting unit, which is not shown here, reaches to the predetermined temperature. When the rotary drive controller unit 803 determines that the temperature of the surface of the substrate S reaches to the predetermined temperature and that the temperature of the inside of the first source gas tube 21 reaches to the predetermined temperature, the rotary drive controller unit 803 actuates the motor 522 to cause a rotation of the shaft 521 at a rotating speed according to the information stored in the storage unit 84. More specifically, the rotating speed stored associated with the type of the deposition gas-supplying unit, the activation of which is requested, is retrieved from the storage unit 84 on the basis of the activation request signal to rotate the shaft 521. Then, the substrate S is moved along a circle around the rotation axis L. The rotating speed of the shaft 521 is detected by the rotating speed detecting unit 83, and then the drive of the motor 522 is controlled by the rotary drive controller unit 803 so that the detected rotating speed reaches to the rotating speed stored in the storage unit 84. In addition to above, when the rotary drive controller unit 803 determines that the temperature of the surface of the substrate S does not reach to the predetermined temperature or determines that the temperature of the inside of the first source gas tube 21 does not reach to the predetermined temperature, the rotary drive controller unit 803 does not actuate the motor 522.

When it is determined that the rotating speed detected by the rotating speed detecting unit 83 reaches to the predetermined rotating speed, the valve controller unit 804 controls the open and the close of the respective valves. The valve controller unit 804 retrieves the quantities (flow rates) of the respective supplied gases per unit time stored associated with the type information of the deposition gas-supplying unit, the activation of which is requested, from the storage unit 84 on the basis of the activation request signal. Then, the open and the close of the valves V0, V1, V2, V3, V4 and V5 are controlled on the basis of the respective retrieved flow rates. Here, the valves V0, V1, V2 and V3 are opened, and the valves V4 and V5 are maintained closed. In addition to above, when the rotating speed detected by the rotating speed detecting unit 83 does not reach to the predetermined rotating speed, the control of the open and the close of the valve by the valve controller unit 804 is not conducted. The valves V0, V1, V2 and V3 may be simultaneously opened, or alternatively, and then the valves V1, V2 and V0 may be simultaneously opened after the valve V3 is opened.

Here, the rotating speed of the susceptor 51 in the deposition process may be preferably equal to or higher than 1 rpm, and more preferably equal to or higher than 5 rpm. Having such configuration, the gas concentration supplied by the first source gas tube 21 to substrate S is averaged to provide improved the distribution of the film thickness (in particular, the distribution of the film thickness along the circumferential direction). In addition to above, while the upper limit of the rotating speed is not particularly limited to any specific speed, the upper limit may preferably be equal to or lower than 2,000 rpm, in view of easy configuration of the rotation mechanism.

The gases are supplied to the deposition chamber 4 according to the following scheme by opening the valves V0, V1, V2 and V3. First of all, a carrier gas and a gas containing a halogen (for example, HCl gas) for creating a reactive gas are supplied in a vessel 24 through the duct 25. Then, the above-described gas is reacted with the raw material contained in the vessel 24 to create a gas containing a group-III element and a halogen, for example, gallium chloride (GaCl) gas. The gas containing the group-III element and the halogen is discharged through the duct 26 from the vessel 24 to be supplied to the inside of the deposition chamber 4 from the discharge port of the second inner tube 213. Further, a reactive gas containing the group-V element is supplied to the inside of the deposition chamber 4 from outer tube 211. At this time, a non-reactive gas, which is not reactive with a gas containing the group-III element and halogen and with a reactive gas, is exhausted from the first inner tube 212, so that a contact between the reactive gas discharged from the outer tube 211 and the gas containing group-III element and halogen discharged from the second inner tube 213 is inhibited in vicinity of the discharge port of the first source gas tube 21.

On the other hand, the gas containing the group-V element is supplied to the interior of the deposition chamber 4 from the supply tube 7. In the present embodiment, gas containing the group-V element is supplied toward the above-described other regions in the deposition chamber 4 during the entire operation for rotating the susceptor 51, revolving the substrate S, and supplying the source gas from the first source gas tube 21. More specifically, the valve controller unit 804 controls the supply of the gas from the supply tube 7 so as to supply the gas containing the group-V element from the supply tube 7, while the first source gas is supplied from the first source gas tube 21.

Here, the gas containing the group-III element and halogen and the reactive gas are supplied from the discharge port of the first source gas tube 21, and these gases are reacted to form a III-V compound semiconductor film on the substrate S that is disposed to face the first source gas tube 21. In this regard, the susceptor 51 in the deposition chamber 4 is driven to be rotated by the driving unit 52 during the entire operation for supplying the gas containing the group-III element and halogen and the reactive gas into the deposition chamber 4 from the first source gas tube 21. Therefore, the substrate S on the susceptor 51 is in the state of revolving around the rotation axis L of the susceptor 51 in the deposition through the hydride vapor phase deposition. Thus, the rotation of the susceptor 51 brings the substrate S on the susceptor 51 in the condition that the substrate is alternately situated in a facing-state where the substrate is located in a deposition region that faces the discharge port of the first source gas tube 21 and in an other-state where the substrate is located in other regions except the deposition region (non-deposition regions where almost no source gas is supplied).

Figure 7:
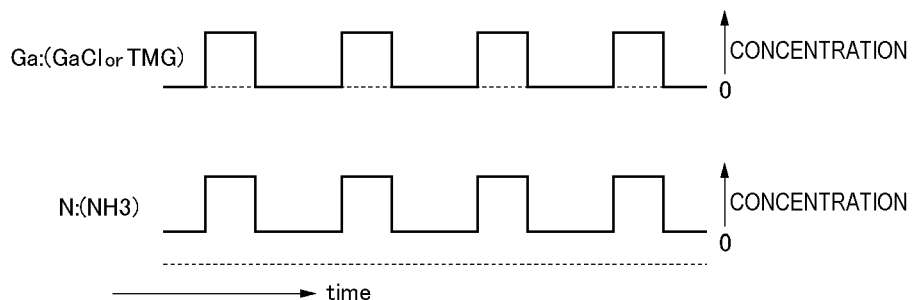
FIG. 7 includes graphs, indicating changes of the concentration of the group-III element and the concentration of the group-V element over one substrate during the deposition process.

In the state that substrate S does not face the discharge port of the first source gas tube 21, the gas containing the group-V element is supplied over the surface of the substrate S from the supply tube 7. Therefore, the change of the concentration of the gas containing the group-III element and the halogen (for example, GaCl gas) and the change of the concentration of the gas containing the group-V element (for example, ammonia gas) over the surface of the substrate S have profiles as shown in FIG. 7. When the substrate S is located in the deposition region right under the discharge port of the first source gas tube 21, the atomic concentration of the group-III element and the atomic concentration of the group-V element over the surface of the substrate S are increased. On the other hand, when the substrate S revolves around the rotation axis L, the substrate S is located in other regions which are out of the deposition region, and therefore the atomic concentration of the group-III of the surface of the substrate S is zero. However, the gas containing the group-V element is supplied from the supply tube 7. The flow rate of the gas containing the group-V element from the supply tube 7 (quantity of atoms of the group-V element supplied per unit time) is lower than the flow rate of the reactive gas from the first source gas tube 21 (quantity of atoms of the group-V element supplied per unit time). For example, the flow rate of the gas containing the group-V element from the supply tube 7 (quantity of atoms of the group-V element supplied per unit time) is from one half ($1/2$) to one tenth ($1/10$) of the flow rate of the reactive gas from the first source gas tube 21 (quantity of atoms of the group-V element supplied per unit time). Since the gas containing the group-V element is supplied from the supply tube 7 as described above, the atomic concentration of the group-V element is not zero, while such concentration is lower than the atomic concentration of the group-V element over the surface of the substrate S located in the deposition region. Such decreased atomic concentration of the group-V element over the surface of the substrate S leads to decreased pressure exerted to atoms of the group-III element, such that the surface diffusion of atoms of the group-III element is activated. This allows accelerating the surface diffusion of atoms of the group-III element adsorbed to the growth surface, and the atoms reaches to kinks and steps formed in the growth surface. Such scheme of the crystalline growth in this way results in obtaining improved crystal that is derived from the crystallinity of the underlying layer.

As described above, a film is formed on the substrate S, and then, the operator stops the operation of the hydride deposition gas-supplying unit 2 of the vapor deposition apparatus 1, and activating the organometallic deposition gas-supplying unit 3. The valve controller unit 804 of the controller unit 80, which accepts the request for stopping the hydride deposition gas-supplying unit 2, closes the valves V0, V1 and V2. In this case, the valve V3 is not closed. The valve V3 is remained to be opened to inhibit a decomposition of the film formed on the substrate S after the hydride deposition gas-supplying unit is stopped and before the metal organic chemical vapor deposition is started. Meanwhile, the rotary drive controller unit 803 of the controller unit 80, which accepts the request for stopping the hydride deposition gas-supplying unit 2, stops the drive of the motor 522. Further, the second temperature controller unit, which is not shown, accepts the request for stopping the hydride deposition gas-supplying unit 2, and stops the heating of the first source gas tube 21.

The temperature controller unit 802, which accepts the request for stopping the hydride deposition gas-supplying unit 2 and for starting the activation of the organometallic deposition gas-supplying unit 3, retrieves the temperature of the first source gas tube 21 stored associated with the type information of the deposition gas-supplying unit, the activation of which is requested, from the storage unit 84. The temperature controller unit 802 conducts the control of the activation of the heater 53. On the other hand, the surface temperature of substrate S is detected by the temperature detecting unit 82. The temperature controller unit 802 determines whether or not the temperature of the surface of the substrate S detected by the temperature detecting unit 82 reaches to the predetermined temperature stored in the storage unit 84, and the activation of the heater 53 is controlled so as to reach to the predetermined temperature. In addition to above, a cooling unit may be additionally provided in order to cool the substrate S to a certain temperature.

The rotary drive controller unit 803 determines whether or not the temperature of the surface of the substrate S detected with the temperature detecting unit 82 reaches to the predetermined temperature stored in the storage unit 84, and when it determines that the detected temperature reaches to the predetermined temperature, the rotary drive controller unit 803 actuates the motor 522 to cause a rotation of the shaft 521 at a rotating speed according to the information stored in the storage unit 84. In addition to above, when the rotary drive controller unit 803 determines that the temperature of the surface of the substrate S detected by the temperature detecting unit 82 does not reach to the predetermined temperature stored in the storage unit 84, it does not actuate the motor 522. The rotating speed stored associated with the type information of the deposition gas-supplying unit, the activation of which is requested, is retrieved from the storage unit 84 on the basis of the activation request signal. Then, it rotates the shaft 521. Then, the substrate S is moved along the circle around the rotation axis L. The rotating speed of the shaft 521 is detected by the rotating speed detecting unit 83, and then the drive of the motor 522 is controlled by the rotary drive controller unit 803 so that the detected rotating speed reaches to the rotating speed stored in the storage unit 84.

The drive of the motor 522 causes the travel of the substrate S along the circle around the rotation axis L.

The rotating speed of the susceptor 51 in the deposition process may be preferably equal to or higher than 1 rpm, and more preferably equal to or higher than 5 rpm. Having such configuration, the gas concentration supplied by the second source gas tube 31 to substrate S is averaged to provide improved the distribution of the film thickness (in particular, the distribution of the film thickness along the circumferential direction). In addition to above, while the upper limit of the rotating speed is not particularly limited to any specific speed, the upper limit may preferably be equal to or lower than 2,000 rpm, in view of easy configuration of the rotation mechanism.

Next, when the valve controller unit 804 determines that the rotating speed detected by the rotating speed detecting unit 83 reaches to the predetermined rotating speed, the open and close of each of the valves is controlled. The valve controller unit 804 retrieves the quantities (flow rates) of the respective supplied gases per unit time stored associated with the type information of the deposition gas-supplying unit, the activation of which is requested, from the storage unit 84. Then, the open and the close of the valves V0, V1, V2, V3, V4 and V5 are controlled on the basis of the retrieved flow rates. Here, the valves V4 and V5 are opened. In addition to above, the valves V0 and V1 are maintained closed. Further, the valve controller unit 804 controls the level of the open of the valve V3 on the basis of flow rate stored in the storage unit 84. When the rotating speed detected by the rotating speed detecting unit 83 does not reach to the predetermined rotating speed, the control of the open and the close of the valve by the valve controller unit 804 is not conducted.

When the valves V4 and V5 are opened, a gas containing an organic metal is supplied into the duct 34, and further, a reactive gas containing a halogen is supplied into the duct 33. Then, these gases are supplied into the deposition chamber 4 through the shower head 32. On the other hand, the gas containing the group-V element is supplied through the valve V3 into the supply tube 7, and the gas is supplied to the inside of the deposition chamber 4.

Here, the gas containing the organic metal and the reactive gas are supplied from the discharge port of the second source gas tube 31, and the reaction of these gases are caused to deposit an III-V compound semiconductor film on the substrate S opposed to the second source gas tube 31. In this regard, the susceptor 51 in the deposition chamber 4 is driven to be rotated by the driving unit 52 during the entire operation for supplying the gas containing the organic metal and the reactive gas into the deposition chamber 4 from the second source gas tube 31. Therefore, the substrate S on the susceptor 51 is in the state of revolving around the rotation axis L of the susceptor 51 in the deposition through the metal organic vapor deposition. Thus, the rotation of the susceptor 51 brings the substrate S on the susceptor 51 in the condition that the substrate is alternately situated in a facing-state where the substrate is located in a deposition region that faces the discharge port of the second source gas tube 31 and in an other-state where the substrate is located in other regions except the deposition region (non-deposition regions where almost no source gas is supplied).

In the state that substrate S does not face the discharge port of the second source gas tube 31, the gas containing the group-V element is supplied over the surface of the substrate S from the supply tube 7. Therefore, the change of the concentration of the gas containing the group-III element and the change of the concentration of the gas containing the group-V element over the surface of the substrate S have profiles as shown in FIG. 7. The flow rate of the gas containing the group-V element from the supply tube 7 (quantity of atoms of the group-V element supplied per unit time) is lower than the flow rate of the reactive gas from the second source gas tube 31 (quantity of atoms of the group-V element supplied per unit time). For example, the flow rate of the gas containing the group-V element from the supply tube 7 (quantity of atoms of the group-V element supplied per unit time) is from one tenth (1/10) to one thirtieth (1/30) of the flow rate of the reactive gas from the second source gas tube 31 (quantity of atoms of the group-V element supplied per unit time). Since the gas containing the group-V element is supplied from the supply tube 7 as described above, the atomic concentration of the group-V element is not zero, while such concentration is lower than the atomic concentration of the group-V element over the surface of the substrate S located in the deposition region. In the present embodiment, the susceptor 51 is rotated, and the substrate S revolves around the rotation axis L and gas containing the group-V element is supplied from the supply tube 7 toward the above-described other regions during the entire operation for supplying the second source gas from the second supply tube 31. More specifically, the valve controller unit controls the supply of the gas from the supply tube 7 so as to supply the gas containing the group-V element from the supply tube 7, while the second source gas is supplied from the second source gas tube 31.

Here, it is preferable to configure that the flow rate of the gas from the supply tube 7 in the case that the hydride deposition gas-supplying unit 2 is activated to conduct the hydride vapor phase deposition is different from the in the case that the organometallic deposition gas-supplying unit 3 is activated to conduct the metal organic chemical vapor deposition. This allows depositing desired films in both of the hydride vapor phase deposition process and the metal organic chemical vapor deposition process. Then, the operator stops the operation of the organometallic deposition gas-supplying unit 3 of the vapor deposition apparatus 1. The valve controller unit 804 of the controller unit 80, which accepted the request for stopping, closes the valves V3, V4 and V5. All of the valves V3, V4 and V5 may be simultaneously shut, or the valve V3 may be closed after the valves V4 and V5 are shut. The rotary drive controller unit 803 of the controller unit 80, which accepted a request for stopping, stops the driving of the motor. Further, the temperature controller unit 802, which accepted a request of stopping, stops the activation of the heater 53.

As described above, the vapor deposition apparatus 1 can be employed to create semiconductor devices such as semiconductor light emitting devices of, for example, laser, light emitting diode or the like, on the substrate S.

Next, advantageous effects obtainable by employing the configuration of the present embodiment will be described. According to the present embodiment, the substrate S is transferred within the deposition chamber 4 so that the substrate is alternately situated in a facing-state where the substrate is located in the deposition region that faces the discharge port for supplying the source gas and in an other-state where the substrate is located in other region except the deposition region, while the first source gas is supplied from the discharge port of the first source gas tube 21 or while the second source gas is supplied from the discharge port of the second source gas tube 31. This allows alternately conducting the operation for supplying the source gas over the surface of the substrate S and the operation without supplying the source gas. The process without supplying the source gas allows accelerating a diffusion of the group-III element serving as the raw material, such that the III-V compound semiconductor film with improved crystallinity can be obtained.

Further, the apparatus also comprises a supply tube 7 for supplying a gas containing a group-V element for the substrate S located in other regions that are not the deposition region. The supply of the gas containing the group-V element from the supply tube 7 can provide a certain level of pressure to atoms of the group-V element over the surface of the substrate S under a condition where a source gas is not supplied, so that an elimination of atoms of the group-V element from the surface of the substrate S can be prevented. In particular, the flow rate of the gas containing the group-V element from the supply tube 7 is adjusted to be lower than the flow rate of the reactive gas containing the group-V element from the activated source gas tube (first source gas tube 21 or second source gas tube 31) of the gas-supplying unit, such that a desirable pressure can be provided to atoms of the group-V element situated over the surface of the substrate S while accelerating the diffusion of atoms of the group-III element, thereby preventing atoms of the group-V element from being eliminated from the surface of the substrate S.

The supply tube 7 is separately provided from the second source gas tube 31 and the first source gas tube 21, and is also a tube that is independent from the source gas tubes 31 and 21, so that the flow rate of the supplied gas containing the group-V element can be controlled, independently from the flow rates of the supplied gases from the second source gas tube 31 and the first source gas tube 21. This allows providing desirable pressure over the surface of the substrate S, so that an elimination of atoms of the group-V element from the surface of the substrate S can be inhibited, while the diffusion of atoms of the group-III element over the surface of the substrate S is accelerated, achieving improved crystallinity of the deposited film.

Further, in the present embodiment, the gas containing the group-V element is continuously supplied toward the above of the substrate S located in other region from the supply tube 7 in the deposition process. Therefore, in the deposition process, relatively uniform atomic concentration of the group-V element over the surface of the substrate S located in other region outside of the deposition region can be maintained. More specific description presents that the vapor deposition apparatus 1 is configured that during the deposition process the residual gas in the deposition chamber 4 (for example, the unconsumed source gas that did not contribute to the deposition) is discharged from the duct 6 during the deposition process. Since the atoms of the group-V element in the above-described other region are also exhausted from the duct 6, the gas containing the group-V element is continuously supplied toward the above of the substrate S located in other region from the supply tube 7, so that relatively uniform atomic concentration of the group-V element over the surface of the substrate S located in other region outside of the deposition region can be maintained. This allows providing a constant pressure exerted to atoms of the group-III element over the surface of the substrate S located in other region outside of the deposition region to prevent the variation caused in the diffusion length of atoms of the group-III element. Therefore, the film of the III-V compound semiconductor having desired crystallinity can be obtained.

Further, in the present embodiment, the supply tube 7 is configured to supply a gas toward regions except the deposition region right under the first source gas tube 21 and the second source gas tube 31. More specifically, while the holes 71 are formed in the tip section of the supply tube 7, such holes 71 are not disposed on a straight line through the center of the first source gas tube 21 and the center of the supply tube 7 and not disposed on a straight line through the center of the second source gas tube 31 and the central of the supply tube 7 in a plan view viewed from the rotation axis direction. The use of the supply tube 7 having such structure prevents the flow of the source gas supplied from the discharge port of the first source gas tube 21 and the flow of the source gas supplied from the discharge port of the second source gas tube 31 from being disturbed by the gas supplied from the supply tube 7.

Further, the use of the supply tube 7 also prevents a ratio of V-group and III-group (V/III ratio) in the gas supplied from the first source gas tube 21 or the second source gas tube 31 from being changed by the gas supplied from the supply tube 7.

Further, in the present embodiment, the single supply tube 7 is disposed in the inside of the circular trance of the substrate S, and the gas is radially discharged from the supply tube 7. This avoids the necessity for providing a number of additional supply tubes. Further, since the tip section of the supply tube 7 is located on the rotation axis L in the present embodiment, the distance between the supply tube 7 and the substrate S is maintained constant, whatever location on the circular trance of the substrate S revolving around the rotation axis L the substrate S is disposed. The gas containing the group-V element is supplied from the supply tube 7 toward the upper side of the substrate S, and the concentration of the gas containing the group-V element over the revolving substrate S can be relatively uniformly maintained.

Further, the vapor deposition apparatus 1 of the present embodiment is configured, in which each of the first source gas tube 21 of the hydride deposition gas-supplying unit 2 and the second source gas tube 31 of the organometallic deposition gas-supplying unit 3 is coupled to the interior of the deposition chamber 4, and gases are supplied from each of the hydride deposition gas-supplying unit 2 and the organometallic deposition gas-supplying unit 3 into the deposition chamber 4. Therefore, for example, the following process can be achieved by employing the vapor deposition apparatus 1:

the film is deposited on the substrate S by supplying the gas from the hydride deposition gas-supplying unit 2 in the state that the supply of the gas from the organometallic deposition gas-supplying unit 3 is stopped, and then the supply of the gas from the hydride deposition gas-supplying unit 2 is stopped, the supply of the gas from the organometallic deposition gas-supplying unit 3 is started without waiting the hydride deposition gas-supplying unit 2 being cooled, and the film is deposited on the substrate S.

Further, in the present embodiment, the discharge port of the first source gas tube 21 to the deposition chamber 4 and the discharge port of the second source gas tube 31 to the deposition chamber 4 are disposed on the circular trance of the substrate S in a plan view viewed from the direction along the driving unit 52 of the transfer unit 5 by the rotary drive of the susceptor 51. Therefore, the use of the gas from the discharge port of the first source gas tube 21 or the discharge port of the second source gas tube 31 achieves a deposition of the film on the substrate S by only the rotary drive of the susceptor 51.

Further, in the present embodiment, the rotary drive of the susceptor 51 is continued during the deposition process. The temperature around the discharge port of the first source gas tube 21 (or the discharge port of the second source gas tube 31) is lower than the temperature around the substrate S during the deposition process, and a flow of a gas from the side of the substrate S moving upward toward the side of the discharge port may be created. When such flow of the gas is fast, such fast flow disturbs the flow of the gas supplied from the discharge port to the substrate S, the susceptor is rotated during the deposition to provide a centrifugal force to the gas over the surface of the susceptor, so that the flow of the gas from the side of the substrate S moving upward toward the side of the discharge port can be reduced. This allows depositing the film on the substrate S with improved efficiency.

Further, in the present embodiment, the susceptor 51 supports a plurality of substrates S. Then, the susceptor 51 supporting plurality of substrates S is rotated at high speed, so that the respective substrates S consecutively face the discharge port of the first source gas tube 21 (or the discharge port of the second source gas tube 31) to achieve the depositions of the films on the respective substrates S. As described above, the depositions of the films on the plurality of substrates S while rotating the susceptor 51 in this manner reduces the variation of the quality of film deposited on the respective substrates S, which may otherwise caused due to the difference of the location from the discharge port of the first source gas tube 21 (or the discharge port of the second source gas tube 31).

Further, the present embodiment is configured that, when the gas is supplied from the hydride deposition gas-supplying unit 2, the gas containing the halogen is supplied from the second inner tube 213 and the reactive gas is supplied from the outer tube 211, and further, the non-reactive gas, which is non-reactive with the gas containing the halogen and the reactive gas, is supplied from first inner tube 212. This allows reducing a contact between the reactive gas discharged from the outer tube 211 and the gas containing group-III element and halogen discharged from the second inner tube 213 in vicinity of the discharge port of the first source gas tube 21.

Further, the present embodiment is configured that the heating unit for heating the inside of the first source gas tube 21 is provided in the periphery of the first source gas tube 21, and the thermal barrier unit 22 for shielding heat from the heating unit is disposed in the periphery of the heating unit. Having such configuration, an influence of the heat to the organometallic deposition gas-supplying unit 3 can be inhibited. Further, the cooling unit 224 may be used as the thermal barrier unit 22 to further ensure shielding the heat.

Further, in the present embodiment, number of the substrates S processible in the HVPE process employing the hydride deposition gas-supplying unit 2 is the same as number of the substrates S processible in the MOCVD process employing the organometallic deposition gas-supplying unit 3. Therefore, for example, all of the substrates S processed in the HVPE process employing the hydride deposition gas-supplying unit 2 can be processed in the MOCVD process employing the organometallic deposition gas-supplying unit 3, and thus this provides improved efficiency in the production. Further, this also allows achieving the processing with both of the HVPE process and the MOCVD process without taking the substrates S out from the deposition chamber 4, so that a contamination of the substrate S or a deterioration of the crystallinity of the film by the evaporation of atoms in the surface and the like after the deposition by the HVPE process and before starting the deposition by the MOCVD process can be reduced.

Figure 8:
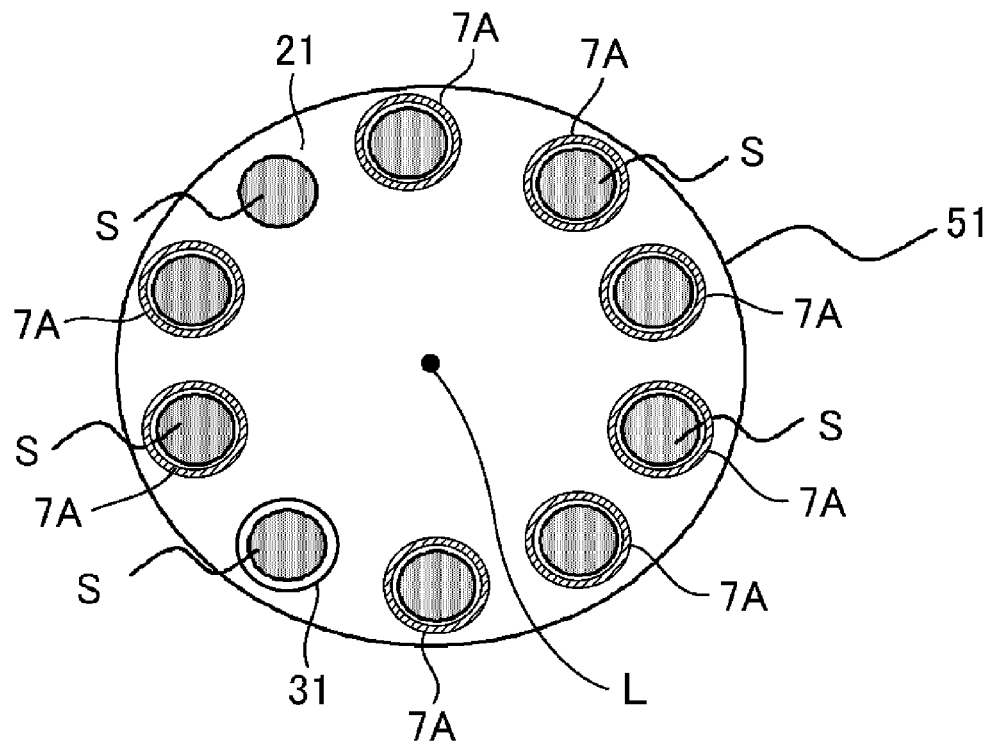
FIG. 8 is a cross-sectional view, illustrating a vapor deposition apparatus according to a modified embodiment of the present invention.

It is apparent that the present invention is not limited to the above-mentioned embodiments, and a modification or a change without departing from the scope and spirit of the invention can also be included in the present invention. For example, while a single first source gas tube 21 and a single second source gas tube 31 are provided in the vapor deposition apparatus 1 in the above-described embodiment, a plurality of first source gas tubes 21 and/or a plurality of second source gas tubes 31 may be provided. Further, while the above-described embodiment is configured to supply the gas toward the radial directions from a single supply tube 7, the present invention is not limited thereto. For example, as shown in FIG. 8, a plurality of supply tubes 7A may be provided. The respective supply tubes 7A are located on the circular trance of the revolving substrate S, and face the surface of the substrate S. Having such configuration, the gas containing the group-V element may be supplied over the substrate S.

Further, while the vapor deposition apparatus 1 of the above-described embodiment includes both of the hydride deposition gas-supplying unit 2 and the organometallic deposition gas-supplying unit 3, the present invention is not limited thereto, and the apparatus may alternatively includes only one supplying unit selected from the hydride deposition gas-supplying unit 2 and the organometallic deposition gas-supplying unit 3.

Further, while the hydride deposition gas-supplying unit 2 is employed to conduct the hydride vapor phase deposition and then the organometallic deposition gas-supplying unit 3 is employed to conduct the metal organic chemical vapor deposition in the above-described embodiments, the present invention is not limited thereto. For example, and then the hydride deposition gas-supplying unit 2 may be employed after the organometallic deposition gas-supplying unit 3 is employed.

In addition, while the above-described embodiment is configured that the first source gas tube 21 and the second source gas tube 31 are located above the substrate S and the gas from the first source gas tube 21 or the second source gas tube 31 flows from the upper side toward the lower side, the top and the bottom of the configuration may be reversed to direct the gas from the lower side toward the upper side. In addition, the first source gas tube 21 and the second source gas tube 31 may alternatively be arranged so as to direct their longitudinal direction along a horizontal direction (the first source gas tube 21 and the second source gas tube 31 may be disposed along the transverse direction in FIG. 1).

EXAMPLES

Next, examples of the present invention will be described.

Example 1

Depositions were conducted by employing the vapor deposition apparatus 1 that is similar to the apparatus of the above-described embodiment.

A sapphire substrate was employed for the substrate S. Ten substrates S were disposed on the susceptor 51. The temperature of the substrate S was set to 500 degrees C., and $NH_3$ gas was supplied from the supply tube 7 at a flow rate of 0.5 L/min., and the second source gas (trimethylgallium (TMG) gas at 2 cc/min., and $NH_3$ gas at 10 L/min.) was supplied from the second source gas tube 31. Then, the MOCVD process was conducted for two minutes. During the depositions, supplies of the respective gases from the supply tube 7 and the second source gas tube 31 were continued. The rotating speed of the susceptor 51 in the deposition process was set to 20 rpm (first deposition process). Then, the supply of the second source gas from the second source gas tube 31 was once stopped, and the temperature of the substrate S was increased to 1,000 degrees C., and then the condition was maintained for five minutes. In such period, the supply of $NH_3$ gas from the supply tube 7 was continued. Next, TMG gas at 2.5 cc/min., and $NH_3$ gas at 10 L/min. were supplied from the second source gas tube 31, and $NH_3$ gas at 0.5 L/min. was supplied from the supply tube 7. Then, the MOCVD process was conducted at the substrate temperature of 1,000 degrees C. for 60 minutes. During the depositions, supplies of the respective gases from the supply tube 7 and the second source gas tube 31 were continued. The rotating speed of the susceptor 51 in the deposition process was set to 20 rpm (second deposition process). A GaN film having a thickness of about 1.5 micrometer (micron) was obtained by the above-described process. The deposited GaN film had a mirror surface.

The GaN film was analyzed by X-ray diffraction (rocking curve), and considerably improved crystallinity was obtained, in which the full width at half maximum (FWHM) for (002) diffraction was 200 arcsec., and the FWHM for (102) diffraction was 250 arcsec.

Comparative Example 1

The vapor deposition apparatus having no supply tube 7 was employed to conduct a deposition process. The configuration of the vapor deposition apparatus employed in the Comparative Example 1 were same as the vapor deposition apparatus 1 of Example 1, except that no supply tube 7 was employed. More specifically, the conditions of Comparative Example 1 was similar to that of Example 1, except that no supply of a gas from the supply tube 7 was conducted in the first deposition process and the second deposition process. A GaN film having a thickness of about 1.5 micrometer (micron) was obtained. The surface of a the GaN film was clouded.

Comparative Example 2

Figure 9:
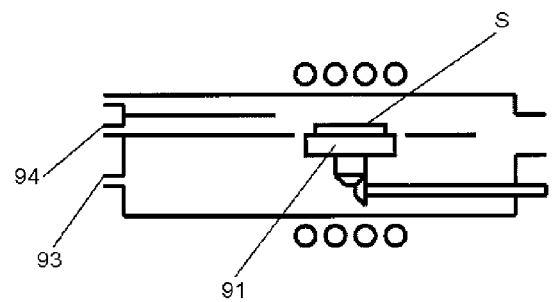
FIG. 9 is a schematic diagram, illustrating a conventional vapor deposition apparatus.

An MOCVD apparatus shown in FIG. 9 was employed to conduct a deposition process. A sapphire substrate S was disposed on a susceptor 91, and trimethylgallium gas was supplied at 0.2 cc/min. from a gas supply tube 93, and $NH_3$ gas was supplied at 10 L/min. from a gas supply tube 94. The temperature of the substrate was set to 500 degrees C., and the MOCVD process was conducted for two minutes. Then, the supply of the source gas from the gas supply tube 93 and the gas supply tube 94 was stopped, and the substrate temperature was set to 1,000 degrees C. and the condition was maintained for five minutes. Next, trimethylgallium gas at 0.25 cc/min. was supplied from the gas supply tube 93, and $NH_3$ gas at 5 L/min. was supplied from the gas supply tube 94. Then, the substrate temperature was set to 1,000 degrees C. and the MOCVD process was conducted for 60 minutes. A GaN film having a thickness of about 1.5 micrometer and having a mirror surface was obtained by such process. The film was analyzed by X-ray diffraction (rocking curve), and the full width at half maximum (FWHM) for (002) diffraction was 300 arcsec., and the FWHM for (102) diffraction was 400 arcsec.

In Example 1, the source gas was supplied from the second source gas tube 31 to the deposition region, and ammonia gas was supplied from the supply tube 7 to other region except the deposition region. The rotation of the susceptor achieved that the substrates S were alternately situated in the state that the substrate S was located in the deposition region opposed to the second source gas tube 31 and in the state that the substrate S was located in other region. In the state that the substrate S is located in other region, the second source gas is not supplied over the surface of the substrate S, and the deposition of Ga atom was interrupted. This reduces the pressure on the surface of the substrate S to create the condition, in which the diffusion of surface atoms is easily occurred. It is considered that the crystallinity is improved because surface atoms adsorbed onto the substrate S migrates to an optimum site by the diffusion. In addition to this, ammonia gas from the supply tube 7 is supplied over the surface of the substrate S in the state that the substrate S is located in other region. In particular, since the supply tube 7 is the separate tube that is independent from the second source gas tube 31, the amount of the supply of ammonia gas can be controlled, regardless of the amount of the supply of ammonia gas from second source gas tube 31. This allows to lower the pressure on the surface of the substrate S, and thus elimination of nitrogen from the surface of the substrate S can be inhibited, while accelerating the diffusion of atoms over the surface of the substrate, providing improved crystallinity. On the contrary, Comparative Example 1 is configured that a gas is not supplied to other region, and thus, when the substrate S is located in other region by moving the substrate S due to the drive of the susceptor, elimination of nitrogen from the surface of the substrate is occurred to provide the clouded surface and deteriorated crystallinity. On the other hand, Comparative Example 2 is configured that the supply of the second source over the surface of the substrate at an amount that is required for deposition is continued without interruption, such that the nitrogen partial pressure is high. Therefore, a diffusion of atoms adsorbed to the surface of the substrate S is difficult to be caused. Further, it is also considered that, since the rate of the deposition of atoms is considerably faster, as compared with the diffusion of atoms to optimum sites by the diffusion of atoms located in the surface of the substrate S, improvement in the crystallinity is not achieved.

Example 2

Depositions were conducted by employing the vapor deposition apparatus 1 that is similar to the apparatus of the above-described embodiment. A sapphire substrate was employed for the substrate S. Ten substrates S were disposed on the susceptor 51. The temperature of the substrate S was set to 500 degrees C., and $NH_3$ gas was supplied from the supply tube 7 at a flow rate of 0.5 L/min., and the second source gas (trimethylgallium at 2 cc/min., and $NH_3$ gas at 10 L/min.) was supplied from the second source gas tube 31. Then, the MOCVD process was conducted for two minutes. During the depositions, supplies of the respective gases from the supply tube 7 and the second source gas tube 31 were continued. The rotating speed of the susceptor 51 in the deposition process was set to 5 rpm (first deposition process). Then, the supply of the second source gas from the second source gas tube 31 was once stopped, and the temperature of the substrate S was increased to 1,000 degrees C., and then the supply of $NH_3$ gas from the supply tube 7 was continued for two minutes (0.5 L/min.). Next, the temperature of the substrate S was elevated to 1,000 degrees C., and GaCl at a flow rate of 100 cc/min. and $NH_3$ gas at flow a rate of 2 L/min., were supplied from the first source gas tube 21 to conduct the HVPE process at a temperature of 1,000 degrees C. for 30 minutes. During the depositions, supplies of the respective gases from the supply tube 7 and the first source gas tube 21 were continued. The rotating speed of the susceptor 51 in the deposition process was set to 20 rpm (second deposition process). The flow rate of $NH_3$ gas from the supply tube 7 was 0.5 L/min. The rotating speed of the susceptor 51 in the deposition process was set to 5 rpm (second deposition process).

A GaN film having a thickness of about 10 micrometer (micron) and having a mirror surface was obtained by the above-described process. The GaN film was analyzed by X-ray diffraction (rocking curve), and considerably improved crystallinity was obtained, in which the full width at half maximum (FWHM) for (002) diffraction was 180 arcsec., and the FWHM for (102) diffraction was 230 arcsec.

Comparative Example 3

The vapor deposition apparatus having no supply tube 7 was employed to conduct a deposition process. The configuration of the vapor deposition apparatus employed in the Comparative Example 3 were same as the vapor deposition apparatus 1 of Example 2, except that no supply tube 7 was employed. More specifically, the conditions of Comparative Example 3 was similar to that of Example 2, except that no supply of a gas from the supply tube 7 was conducted in the first deposition process and the second deposition process. A GaN film having a thickness of about 10 micrometer (micron) was obtained. The surface of a the GaN film was clouded.

The invention claimed is:

1. A vapor deposition apparatus for depositing a film of a III-V compound semiconductor on a substrate, comprising:
a deposition chamber for depositing said III-V compound semiconductor film on said substrate;
a plurality of source gas tubes for supplying a source gas in said deposition chamber, said source gas containing a gas containing a group-III element and a reactive gas containing group-V element, which is capable of being reacted with said gas containing group-III element to deposit said III-V compound semiconductor film;
a transfer unit for transferring said substrate in an interior of said deposition chamber; and
a supply tube for supplying a gas containing a group-V element to the interior of said deposition chamber,
wherein said plurality of source gas supply tubes include a hydride deposition gas tube for supplying a gas for hydride vapor phase deposition which supplies a first source gas in said deposition chamber, said first source gas containing a gas containing a halogen and a group-III element and a reactive gas containing a group-V element, and an organometallic deposition tube for supplying a gas for metal organic chemical vapor deposition which supplies a second source gas in said deposition chamber, said second source gas containing a gas containing an organic metal containing a group-III element and a reactive gas containing a group-V element,
wherein said transfer unit comprises a susceptor for supporting said substrate and a driving unit for providing a rotary drive of said susceptor,
wherein said susceptor is configured to be driven by said driving unit so that said substrate supported by said susceptor travels along a circle, center of which is coincide with a rotating axis of said susceptor, discharge ports of said plurality of source gas tubes being located over said circle in plan view viewed from the direction along said rotation axis,
wherein said transfer unit is configured that said substrate travels along said circle so that said substrate is alternately situated in a facing-state where said substrate is located in a deposition region that faces said discharge port of said source gas tube through which said first source gas or said second source gas is exhausted and in an other-state where said substrate is located in other region except said deposition region, while said first source gas is supplied from the discharge port of the hydride deposition gas tube for supplying the gas for hydride vapor phase deposition or while said second source gas is supplied from the discharge port of said organometallic deposition tube for supplying the gas for metal organic chemical vapor deposition,
wherein a tip section of said supply tube extends in parallel with said rotation axis of said susceptor and is disposed in the inside of said circle in plan view viewed from the direction along said rotation axis, and
wherein said gas containing said group-V element is radially exhausted from the tip section of said supply tube toward said substrate located in other region except said deposition region and a region within said deposition chamber except said deposition region.

2. The vapor deposition apparatus as set forth in claim 1, further comprising:
a controller unit for controlling a supply and a stop of a gas containing said group-V element from said supply tube,
wherein said controller unit controls a supply of said gas containing said group-V element from said supply tube so as to continue the supply of said gas from said supply tube while said transfer unit is driven and said source gas is supplied from said source gas tube.

3. The vapor deposition apparatus as set forth in claim 1, wherein the tip section of said supply tube extends on the rotation axis of said susceptor.

4. The vapor deposition apparatus as set forth in claim 1, wherein a plurality of holes for discharging said gas are formed in the side surface of said tip section of said supply tube, each of said plurality of holes being disposed spaced apart from each other along a circumference direction of the tip section of the supply tube, and
wherein said hole is not formed on a straight line drawn through the center of the discharge port of said source gas tube and the center of said tip section of the supply tube in plan view viewed from the direction along said rotation axis.

5. The vapor deposition apparatus as set forth in claim 1, wherein said susceptor retains a plurality of said substrates on one circle, the center of which is the rotation axis of said susceptor.

6. The vapor deposition apparatus as set forth in claim 1, further comprising:
a hydride deposition gas-supplying unit for conducting a hydride vapor phase deposition of a in said deposition chamber;
an organometallic deposition gas-supplying unit for conducting a metal organic chemical vapor deposition in said deposition chamber;
a storage unit; and
a controller unit,
wherein said hydride deposition gas-supplying unit includes said hydride deposition gas tube for supplying the gas for hydride vapor phase deposition as said source gas tube,
wherein said organometallic deposition gas-supplying unit includes said organometallic deposition tube for supplying the gas for metal organic chemical vapor deposition as said source gas tube,
wherein said storage unit is capable of storing a type information of each of the deposition gas-supplying units, and each of flow rates of the gas containing said group-V element exhausting from said supply tube in association with said each of type information of the deposition gas-supplying units, and
wherein said controller unit acquires an information related to a request for activating one of said hydride deposition gas-supplying unit and said organometallic deposition gas-supplying unit, retrieves from said storage unit the stored flow rate of the gas discharged from said supply tube associated with the type information of the deposition gas-supplying unit that is requested to be activated, and then controls a supply of said gas from said supply tube so that a gas containing said group-V element is supplied at the gas flow rate retrieved from said storage unit, while said transfer unit is driven and said source gas is supplied from said source gas tube of said deposition gas-supplying unit that is requested to be activated.

7. A process for depositing a film of a III-V compound semiconductor on a substrate by a vapor deposition, including:
depositing a III-V compound semiconductor film on said substrate with a source gas containing a gas containing a group-III element and a reactive gas containing group-V element that is capable of reacting with said gas containing group-III element,
wherein said substrate is moved in an interior of a deposition chamber so that said substrate is situated alternately in a facing-state and in an other-state while said source gas is supplied to the interior of said deposition chamber from a source gas tube, said facing-state being a state where said substrate is located in a deposition region that faces a discharge port of said source gas tube, and said other-state being a state where said substrate is located in other region except said deposition region, and
wherein said depositing the III-V compound semiconductor film includes supplying a gas containing a group-V element to said substrate located in other region except said deposition region, while said source gas is supplied in said deposition chamber from said source gas tube,
wherein said depositing the III-V compound semiconductor film includes:
depositing a III-V compound semiconductor film on said substrate by a hydride vapor phase deposition with a first source gas containing a gas containing a group-III element and a halogen gas and a reactive gas containing a group-V element, wherein said substrate is moved along a circle within said deposition chamber so that said substrate is situated alternately in a first facing-state and in a first other-state while said first source gas is supplied from a hydride deposition gas tube as said source gas tube to said substrate, said first facing-state being a state where said substrate is located in a deposition region that faces the discharge port of said hydride deposition gas tube, said first other-state being a state where said substrate is located in other region except said deposition region; and
depositing a III-V compound semiconductor film on said substrate by a metal organic chemical vapor deposition with a second source gas containing an organometallic gas containing group-III element and a reactive gas containing group-V element, wherein said substrate is moved along said circle within said deposition chamber so that said substrate is situated alternately in a second facing-state and in a second other-state while said second source gas is supplied from an organometallic deposition tube as said source gas tube to said substrate, said second facing-state being a state where said substrate is located in a deposition region that faces the discharge port of said organometallic deposition tube, and said second other-state being a state where said substrate is located in other region except said deposition region,
wherein said depositing the III-V compound semiconductor film by the hydride vapor phase deposition includes supplying said gas containing group-V element radially from the inside of said circle at a first flow rate over said substrate located in other region except said deposition region, and
wherein said depositing the III-V compound semiconductor film by metal organic chemical vapor deposition includes supplying said gas containing group-V element radially from the inside of said circle at a second flow rate over said substrate located in other region except said deposition region, said first flow rate being different from said second flow rate.

8. The vapor deposition apparatus as set forth in claim 1, wherein said hydride deposition gas tube for supplying the gas for hydride vapor phase deposition comprises an outer tube and an inner tube which is inserted in said outer tube, wherein said outer tube supplies either one of said gas containing the halogen and the group-III element and said reactive gas containing the group-V element which are contained in said first source gas to the interior of said deposition chamber, and wherein said inner tube supplies the other of said gas containing the halogen and the group-III element and said reactive gas containing the group-V element which are contained in said first source gas to the interior of said deposition chamber.

9. The vapor deposition apparatus as set forth in claim 1, wherein said hydride deposition gas tube for supplying the gas for hydride vapor phase deposition comprises an outer tube, a first inner tube which is inserted in said outer tube, and a second inner tube which is inserted in said first inner tube, wherein said outer tube supplies either one of said gas containing the halogen and the group-III element and said reactive gas containing the group-V element which are contained in said first source gas to the interior of said deposition chamber, wherein said second inner tube supplies the other of said gas containing the halogen and the group-III element and said reactive gas containing the group-V element which are contained in said first source gas to the interior of said deposition chamber, and wherein said first inner tube supplies a non-reactive gas which is non-reactive with both of said gas containing the halogen and the group-III element and said reactive gas containing the group-V element to the interior of said deposition chamber.

10. The vapor deposition apparatus as set forth in claim 1, wherein the discharge port of said organometallic deposition tube for supplying the gas for metal organic chemical vapor deposition is provided with a shower head, and wherein said gas containing the organic metal containing the group-III element and said reactive gas containing the group-V element which are contained in said second source gas are separately supplied to the interior of said deposition chamber through different holes of said shower head.

11. The vapor deposition apparatus as set forth in claim 1, further comprising:

a heating unit which is disposed in a circumference of said hydride deposition gas tube for supplying the gas for hydride vapor phase deposition for heating the inside of said hydride deposition gas tube for supplying the gas for hydride vapor phase deposition; and a thermal barrier unit which is disposed in a circumference of said heating unit.

12. The process for depositing films as set forth in claim 7, wherein said gas containing the group-III element and the halogen gas and said reactive gas containing the group-V element which are contained in said first source gas are not in contact with each other in said hydride deposition gas tube, and wherein said organometallic gas containing group-III element and said reactive gas containing group-V element which are contained in said second source gas are not in contact with each other in said organometallic deposition tube.

\* \* \* \* \*